(12) United States Patent
Childs et al.

(10) Patent No.: US 9,627,312 B2
(45) Date of Patent: Apr. 18, 2017

(54) ON-CHIP CAPACITORS AND METHODS OF ASSEMBLING SAME

(75) Inventors: Michael A. Childs, Hillsboro, OR (US); Kevin J. Fischer, Hillsboro, OR (US); Sanjay S. Natarajan, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 145 days.

(21) Appl. No.: 13/995,525

(22) PCT Filed: Oct. 1, 2011

(86) PCT No.: PCT/US2011/054471
§ 371 (c)(1),
(2), (4) Date: Jun. 19, 2013

(87) PCT Pub. No.: WO2013/048522
PCT Pub. Date: Apr. 4, 2013

(65) Prior Publication Data
US 2013/0270675 A1    Oct. 17, 2013

(51) Int. Cl.
*H01L 23/522* (2006.01)
*H01L 49/02* (2006.01)

(52) U.S. Cl.
CPC ...... *H01L 23/5226* (2013.01); *H01L 23/5223* (2013.01); *H01L 28/60* (2013.01); *H01L 2224/0401* (2013.01); *H01L 2224/05016* (2013.01); *H01L 2224/05568* (2013.01); *H01L 2224/13007* (2013.01); *H01L 2224/13099* (2013.01); *H01L 2924/00014* (2013.01)

(58) Field of Classification Search
CPC .................................................. H01L 23/5226

USPC .................. 257/532–535; 438/393, 396, 399
See application file for complete search history.

(56) References Cited

U.S. PATENT DOCUMENTS

| 5,014,097 | A | * | 5/1991 | Kazerounian | .......... G11C 16/30 |
| | | | | | 257/317 |
| 5,909,043 | A | * | 6/1999 | Summerfelt | ............ H01L 28/60 |
| | | | | | 257/298 |

(Continued)

FOREIGN PATENT DOCUMENTS

| CN | 1781190 | 5/2006 |
| TW | I228101 | 1/2005 |

(Continued)

OTHER PUBLICATIONS

Machine translation, Notification of Reason of Refusal, KR 10-2014-7010079, Korean Intellectual Property Office, May 18, 2015 (translation date: Oct. 22, 2105), all pages.*

(Continued)

*Primary Examiner* — Victoria K Hall
(74) *Attorney, Agent, or Firm* — Trop, Pruner & Hu, P.C.

(57) ABSTRACT

An on-chip capacitor a semiconductive substrate is fabricated in a passivation layer that is above the back-end metallization. At least three electrodes are configured in the on-chip capacitor and power and ground vias couple at least two of the at least three electrodes. The first via has a first-coupled configuration to at least one of the first- second- and third electrodes and the second via has a second-coupled configuration to at least one of the first- second- and third electrodes.

7 Claims, 12 Drawing Sheets

(56) References Cited

U.S. PATENT DOCUMENTS

| | | | | |
|---|---|---|---|---|
| 6,188,121 | B1* | 2/2001 | Baldi | H01L 27/0805 257/532 |
| 6,284,586 | B1* | 9/2001 | Seliskar | H01L 27/0688 257/E21.008 |
| 6,385,033 | B1* | 5/2002 | Javanifard et al. | 361/306.2 |
| 6,446,317 | B1* | 9/2002 | Figueroa et al. | 29/25.42 |
| 6,979,854 | B2* | 12/2005 | Yamasaki et al. | 257/310 |
| 7,072,169 | B2* | 7/2006 | Hayashi | H01G 4/30 361/303 |
| 7,560,334 | B2* | 7/2009 | Schwantes | H01L 27/0629 257/E21.248 |
| 2002/0057039 | A1 | 5/2002 | Yoshida | H03H 9/0514 310/320 |
| 2002/0140349 | A1* | 10/2002 | Kato | H01J 11/12 313/582 |
| 2003/0136998 | A1* | 7/2003 | Baniecki et al. | 257/310 |
| 2003/0183008 | A1* | 10/2003 | Bang | B81C 1/0019 73/514.01 |
| 2003/0218473 | A1* | 11/2003 | Yamashita | G01R 31/312 324/750.3 |
| 2005/0082639 | A1* | 4/2005 | Kikuta | H01L 27/0629 257/533 |
| 2005/0139956 | A1* | 6/2005 | Ohkubo | H01L 23/5223 257/532 |
| 2006/0091494 | A1* | 5/2006 | Miyamoto | C01G 29/006 257/532 |
| 2006/0146476 | A1* | 7/2006 | Srinivasan | H01G 4/10 361/306.3 |
| 2006/0154437 | A1 | 7/2006 | Choi | |
| 2007/0164395 | A1* | 7/2007 | Perng et al. | 257/532 |
| 2008/0001253 | A1* | 1/2008 | Mosley | H01G 4/232 257/532 |
| 2008/0055816 | A1* | 3/2008 | Park | H01G 4/08 361/301.4 |
| 2008/0258257 | A1* | 10/2008 | Klee | H01L 23/5223 257/532 |
| 2010/0224960 | A1* | 9/2010 | Fischer | H01L 23/5223 257/532 |
| 2010/0270643 | A1* | 10/2010 | Iwaki | H01L 23/5223 257/532 |
| 2010/0279484 | A1* | 11/2010 | Wang et al. | 438/396 |
| 2010/0309606 | A1* | 12/2010 | Allers | H01L 23/5223 361/306.3 |
| 2011/0032660 | A1* | 2/2011 | Dunn et al. | 361/313 |
| 2011/0037145 | A1* | 2/2011 | Lee | H01L 23/5223 257/532 |
| 2011/0227668 | A1* | 9/2011 | Tanaka | H03H 9/0057 333/133 |
| 2012/0241906 | A1* | 9/2012 | Nakanishi | H01L 23/49827 257/532 |
| 2012/0256193 | A1* | 10/2012 | Hebert | H01L 23/49562 257/77 |
| 2013/0321981 | A1* | 12/2013 | Ahn | H01G 4/30 361/321.2 |
| 2015/0170842 | A1* | 6/2015 | An | H01G 4/30 361/321.2 |
| 2015/0179339 | A1* | 6/2015 | Seo | H01G 4/12 361/301.4 |

FOREIGN PATENT DOCUMENTS

| | | | |
|---|---|---|---|
| TW | 201005897 | 3/2011 | |
| TW | 201136480 | 10/2011 | |
| WO | WO 2011074283 | * 6/2011 | H05K 3/46 |

OTHER PUBLICATIONS

Machine translation, Mar. 2, 2016 SIPO Office Action, translation date: Aug. 11, 2016, EPO.*

Machine translation, SIPO Office Action dated Aug. 15, 2016, translation date: Nov. 23, 2016, Espacenet, all pages.*

International Searching Authority, "Notification of Transmittal of the International Search Report and the Written Opinion of the International Searching Authority," mailed Jun. 27, 2012, in International application No. PCT/US2011/054471.

Search Report of R.O.C., "Transmittal of the Taiwan Search Report and Written Opinion," emailed Jul. 14, 2014, in Taiwan application No. 101135912.

Korean Intellectual Property Office, "Notice of Preliminary Rejection" in Korean Patent Application No. 10-2014-7010079 mailed on May 18, 2015.

State Intellectual Property Office, P.R. China Office Action mailed Mar. 2, 2016 in Chinese Patent Application No. 201180075204.6.

State Intellectual Property Office of the People's Republic of China, Second Office Action mailed Aug. 15, 2016 in Chinese Patent Application No. 201180075204.6.

* cited by examiner

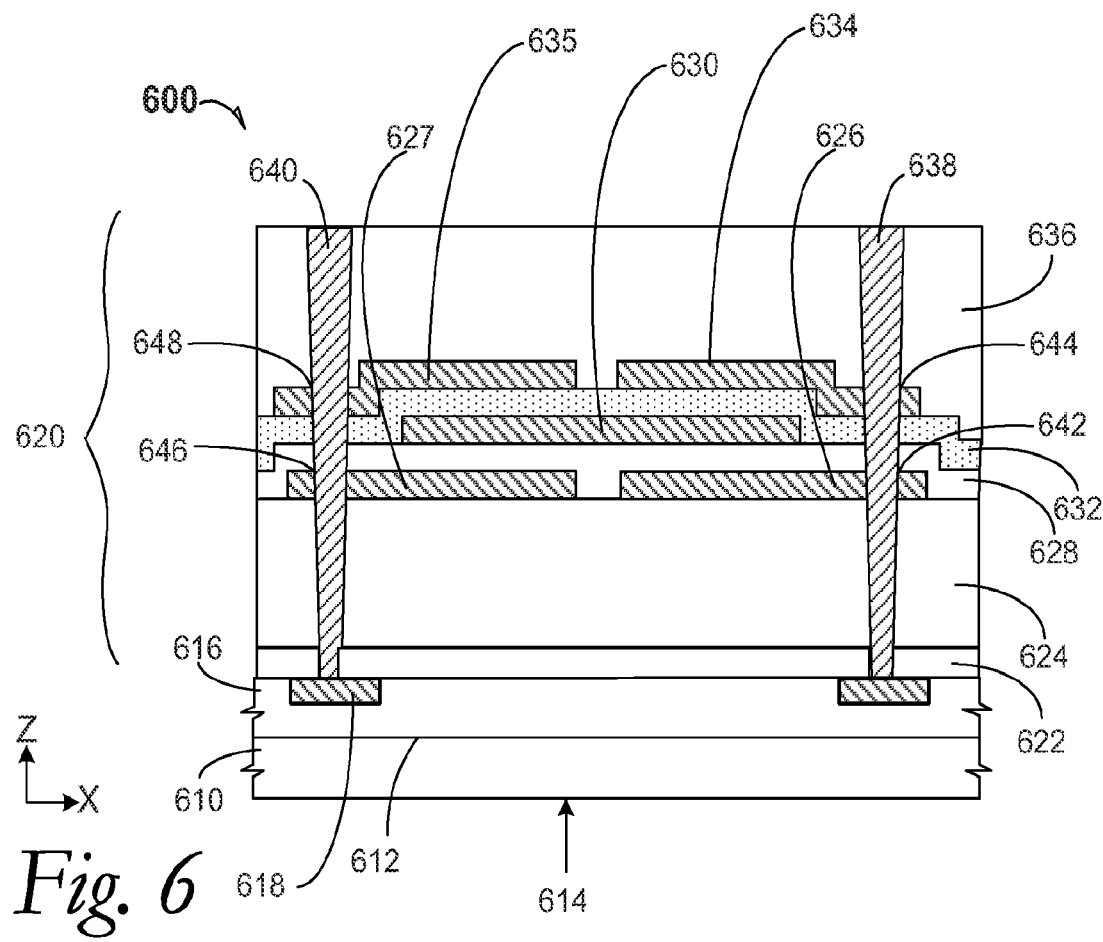
Fig. 6
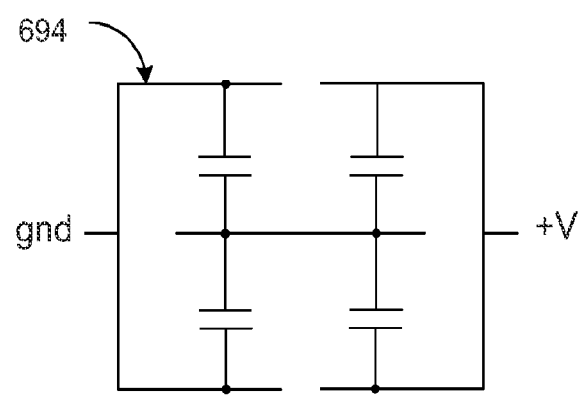

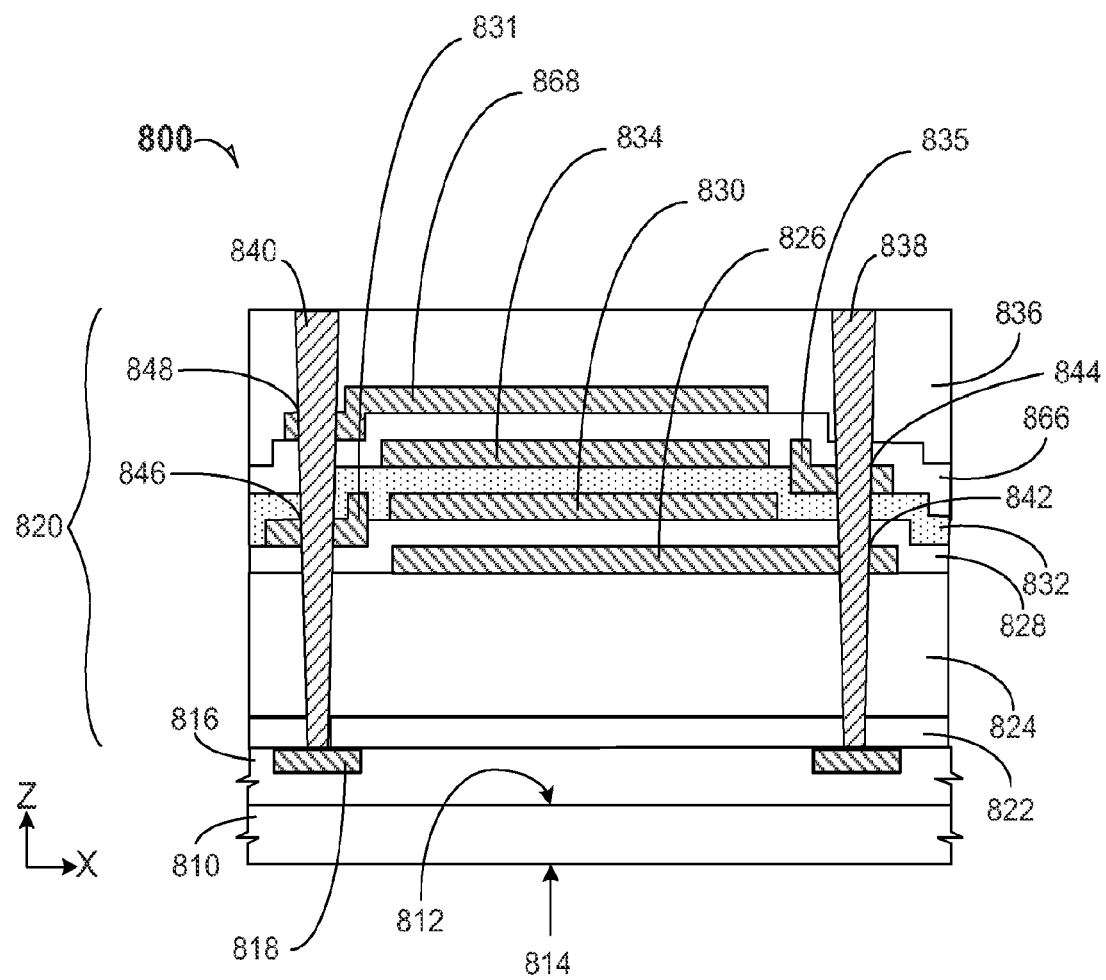
Fig. 8
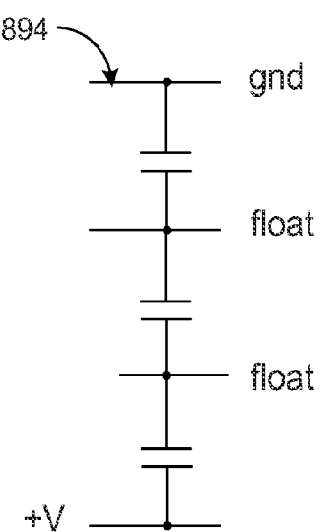

ON-CHIP CAPACITORS AND METHODS OF ASSEMBLING SAME

TECHNICAL FIELD

Disclosed embodiments relate to on-chip capacitors.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which:

FIGS. 2-8 are cross-section elevations of on-chip capacitors according to several example embodiments;

DETAILED DESCRIPTION

Processes are disclosed where offset interposers are assembled and coupled with microelectronic devices as chip packages. Offset interposer embodiments allow for chip-package designers to address interfacing challenges such as between logic devices and memory devices during the packaging process.

Reference will now be made to the drawings wherein like structures may be provided with like suffix reference designations. In order to show the structures of various embodiments more clearly, the drawings included herein are diagrammatic representations of integrated circuit chips assembled to offset interposer embodiments. Thus, the actual appearance of the fabricated chip substrates, alone or in chip packages, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings.

Figure 1:
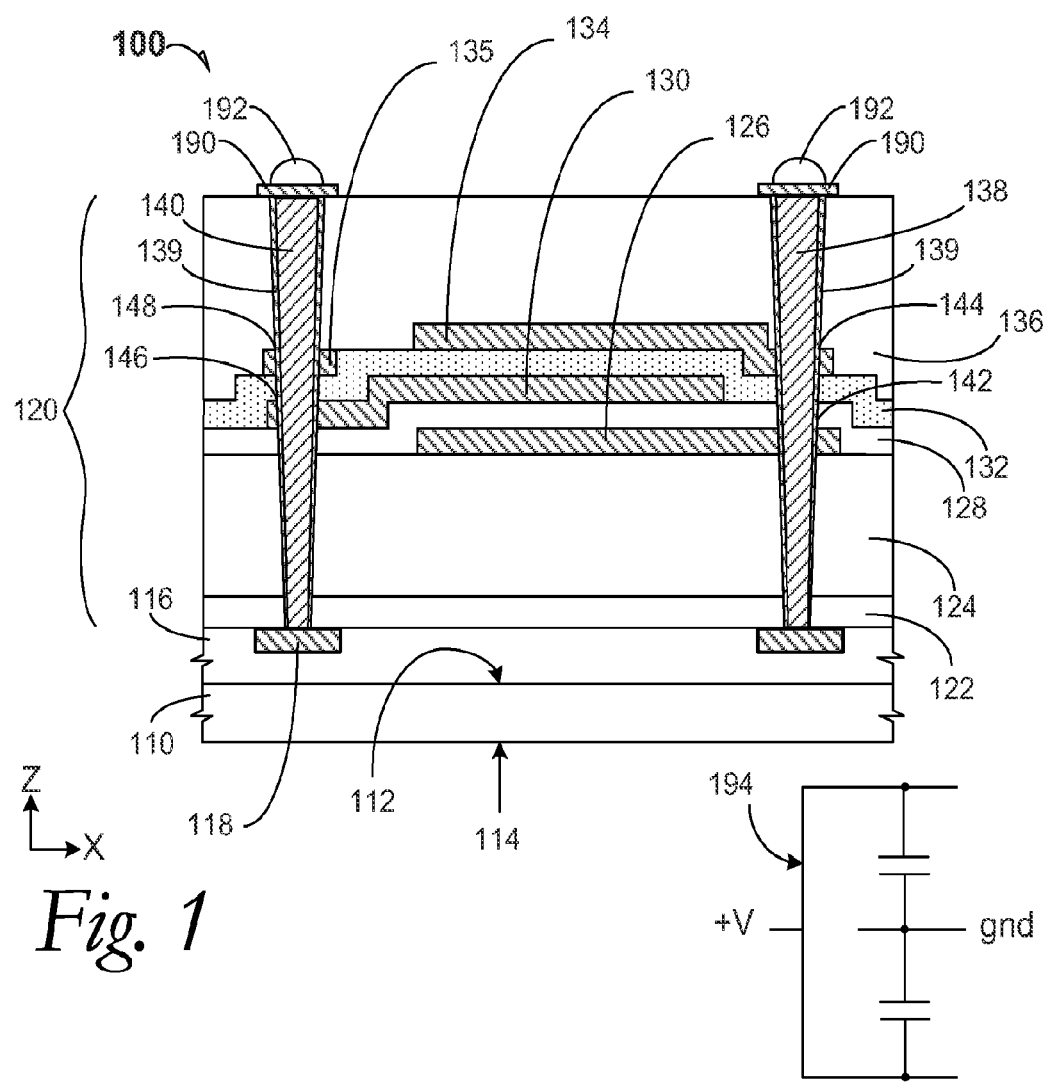
FIG. 1 is a cross-section elevation of an on-chip capacitor according to an example embodiment.

FIG. 1 is a cross-section elevation of an on-chip capacitor 100 according to an example embodiment. A semiconductive substrate 110 includes an active surface 112 and a backside surface 114 as well as a back-end (BE) metallization 116. In an embodiment, the semiconductive substrate 110 is a semiconductor material such as but not limited to silicon (Si), silicon germanium (SiGe), germanium (Ge), or III-V compound semiconductors. The semiconductive substrate 110 can be monocrystalline, epitaxial crystalline, or polycrystalline. In an embodiment, the semiconductive substrate 110 is a semiconductor heterostructure such as but not limited to a silicon-on-insulator (SOI) substrate, or a multi-layered substrate comprising silicon, silicon germanium, germanium, III-V compound semiconductors, and any combinations thereof. Active devices are located at the active surface 112 and they refer to components such as but not limited to gates, transistors, rectifiers, and isolation structures that form parts of integrated circuits. The active devices are coupled as functional circuits by the BE metallization 116.

The BE metallization 116 may also be referred to as a BE interconnect stack. In an embodiment, the semiconductive substrate 110 is a processor die such as that made by Intel Corporation of Santa Clara, Calif. The BE metallization 116 may include metal layers such as from metal-1 (M1) up to metal-n ($M_n$) 118 such as M11, but not limited to M11. In an embodiment, the upper metallization trace 118 is an M11 metallization 118. The BE metallization 116 is illustrated in simplified form, but it comprises multiple levels of interconnects that are isolated from one another by multiple layers of interlayer dielectric (ILD) materials.

An on-chip capacitor structure 120 is disposed above and on the BE metallization 116. In an embodiment, a via etch-stop first layer 122 is formed upon the upper metallization trace 118 as it is exposed through the BE metallization 116. Thereafter, a first via interlayer dielectric layer (VILD) 124 is disposed above the upper metallization trace 118. In this embodiment, the first VILD 124 is disposed above and on the via etch-stop first layer 122. In an embodiment, the via etch-stop first layer 122 is made of a material such as silicon carbide. Other materials may be chosen for the via etch-stop first layer 122 depending upon a given useful application of disclosed embodiments.

In an embodiment, the on-chip capacitor structure 120 is a passivation structure that is assembled on the BE metallization 116. The passivation structure includes the on-chip capacitor structure 120 integral thereto. In an embodiment, the bottom passivation structure that is the first VILD 124 and a top passivation structure that is a second VILD 136.

A patterned first electrode 126 is disposed upon the first VILD 124. A capacitor first dielectric layer 128 is conformally disposed over the patterned first electrode 126. It can be seen that a topography has been started with the capacitor first dielectric layer 128 entirely covering the patterned first electrode 126 as well as exposed portions of the first VILD 124. A patterned second electrode 130 is conformally disposed over the capacitor first dielectric layer 128 and has an effective portion that is substantially parallel-planar with the patterned first electrode 126. A capacitor second dielectric layer 132 is conformally disposed over the patterned second electrode 130. A patterned third electrode 134 is conformally disposed over the capacitor second dielectric layer 132 and has an effective portion that is substantially parallel-planar with the patterned second electrode 130. During forming of the patterned third electrode 134, a dummy third electrode 135 is also formed. And a second VILD 136 is disposed over the capacitor second dielectric layer 132 as well as the patterned third electrode 134 and the dummy third electrode 135.

Electrically conductive materials may be selected to obtain useful capacitor embodiments. In an embodiment, the electrodes 126, 130, and 134 are made from a metal. In an embodiment, the electrodes are a copper composition. In an embodiment, the electrodes are a titanium nitride ($Ti_xN_y$) composition where x and y may be chosen to make up either stoichiometric or non-stoichiometric ratios. In an embodiment, the electrodes are made of titanium. In an embodiment, the electrodes are made of tantalum. In an embodiment, the first electrode 126 is a tantalum nitride ($Ta_xN_y$) composition where x and y may be chosen to make up either stoichiometric or non-stoichiometric ratios.

In an embodiment, electrode thickness is in a range from 20 to 50 nanometer (nm). For example, terminated electrodes may be of a thickness different from floater electrodes. Dielectric materials may be selected to obtain useful capacitor embodiments. In an embodiment, a high-k dielectric (k>6) is used. In an embodiment, a capacitor dielectric material is an oxide. In an embodiment, a capacitor dielectric material is silicon dioxide ($SiO_2$). In an embodiment, a capacitor dielectric material is a hafnium oxide ($Hf_xO_y$) where x and y may be chosen to make up either stoichiometric or non-stoichiometric ratios. In an embodiment, a capacitor dielectric material is an aluminum oxide ($Al_xO_y$) where x and y may be chosen to make up either stoichiometric or non-stoichiometric ratios.

In an embodiment, a capacitor dielectric material is a lead zirconate titanate (PZT) material. In an embodiment, a capacitor dielectric material is a barium strontium titanate (BST) material.

In an embodiment, a mixture of oxides is used such as one oxide for the capacitor dielectric first layer 128 and a different oxide for the capacitor dielectric second layer 132. In an embodiment, a given capacitor dielectric layer is a mixture of two or more oxides. In an example embodiment, the capacitor dielectric first layer 128 is a hafnium oxide and the capacitor dielectric second layer 132 is an aluminum oxide. It may now be understood by these examples that a capacitor dielectric first layer 128 may be of a first composition such as hafnium oxide and the capacitor dielectric second layer 132 may be of a second composition such as aluminum oxide. One layer may be of "the same" as the other layer such as identical chemistries. One layer may be "different" from the other layer such as the same qualitative chemistries but of different stoichiometries. One layer may be "different" from the other layer such as the different qualitative chemistries such as a halfnium oxide in one and an aluminum oxide in the other. One layer may be "different" from the other layer such as the different qualitative chemistries such as a halfnium oxide in one and a mixture of an aluminum oxide and halfnium oxide in the other. One layer may be "different" from the other layer such as the different qualitative chemistries such as an aluminum oxide in one and a mixture of an aluminum oxide and halfnium oxide in the other. By these embodiments it should be understood that other dielectric materials may be mixed and matched where different capacitances are useful between the several electrodes. Electrical coupling of the capacitor structure 120 between the semiconductive substrate 110 and the outside world is accomplished by a power via 138 and a ground via 140. As illustrated in this embodiment, the power via 138 is in contact with both the patterned first electrode 126 and the patterned third electrode 134. Grounding is accomplished in this embodiment by direct contact between the ground via 140 and the patterned second electrode 130.

In an embodiment, the vias 138 and 140 have a via liner adhesion layer 139 that assists in making a useful bond between the vias and adjacent structures. Formation of the via liner adhesion layer 139 may be done by a chemical vapor deposition of a liner material such as titanium or tungsten. In an embodiment, the adhesion layer 139 is titanium. In an embodiment, the adhesion layer 139 is titanium tungsten (TiW). In an embodiment, the adhesion layer 139 is tantalum. Thickness of the adhesion layer 139 may be useful in a range from 50 to 500 Angstrom (Å) according to an embodiment.

In an embodiment, the vias 138 and 140 are filled copper contacts. Electrical coupling of the vias 138 and 140 to the outside world is accomplished in an embodiment by electrical bumps 192 that are disposed on pads 190 that contact the vias. The electrical bumps 192 may be part of a controlled-collapse chip connection (C4) that can be attached to conductive traces of a chip-package substrate. In an embodiment, the electrical bumps 192 have a diameter in a range from 50 to 100 µm.

It may now be understood that the on-chip capacitor structure 120 may be coupled above the second VILD 136 to further materials instead of to a bump. For example, additional BE metallization may be fabricated above the second VILD 136. In an embodiment, the upper portion (Z-direction) of the vias 138 and 140 are contacted by metallization traces or contacts instead of the pads 190 as illustrated. Further illustration of this embodiment is set forth and illustrated at FIG. 2.

Going forward in this disclosure, other on-chip capacitor embodiments (disclosed and illustrated in FIGS. 2-8) may have the liner adhesion layer 139 as well as the electrical bumps 192 coupled to pads 190.

It may now be appreciated that the power via 138 may be referred to as a first via 138 having a first-coupled configuration to at least one of the first—126, second—130, and third electrodes 134; in this embodiment to the patterned first electrode 126 and the patterned third electrode 134. Similarly but according to this embodiment, the ground via 140 may be referred to as a second via 140 having a second-coupled configuration to at least one of the first—126, second—130, and third electrodes 134; in this embodiment to the patterned second electrode 130. It may therefore be appreciated that the first coupled configuration to the first via 138 is different from the second-coupled configuration to the second via 140.

It may now also be appreciated that the respective first- and second vias 138 and 140 each penetrate and contact two metal layers while connecting between the semiconductive substrate 110 and the outside world. In FIG. 1, the first via 138 penetrates and contacts at a first-electrode power contact point 142, also referred to as an electrode terminal region 142, and a third electrode power contact point 144 (also referred to as an electrode terminal region 144). Also, the second via 140 penetrates and contacts at a second-electrode ground contact point 146 and a third dummy electrode contact point 148.

In an embodiment, the on-chip capacitor 100 is used as a decoupling capacitor. The decoupling capacitor can be formed between power (+V) and ground (gnd) to decouple a circuit found in the semiconductive substrate 110 without changing or affecting an existing circuit layout in the silicon. In an embodiment, the on-chip capacitor 100 is used as a noise filter. In an embodiment, the on-chip capacitor 100 is used as a sensor. A circuit diagram 194 illustrates the functional design of the on-chip capacitor 100. The on-chip capacitor 100 represents a metal-insulator-metal-insulator-metal (MIMIM or MIM $IM^1$) structure.

The circuit diagram 194 illustrates parallel +V plates that may impose a useful higher capacitance with a lower maximum voltage ($V_{max}$). The terms like "higher", "moderate", and "lower" are relative terms that are used to compare with a conventional simple capacitor as well as to compare with other disclosed embodiments.

Going forward in this disclosure, it should be understood that materials, methods, and uses of the disclosed on-chip capacitor 100 may be applied to subsequent-disclosed on-chip capacitors.

Figure 1X:
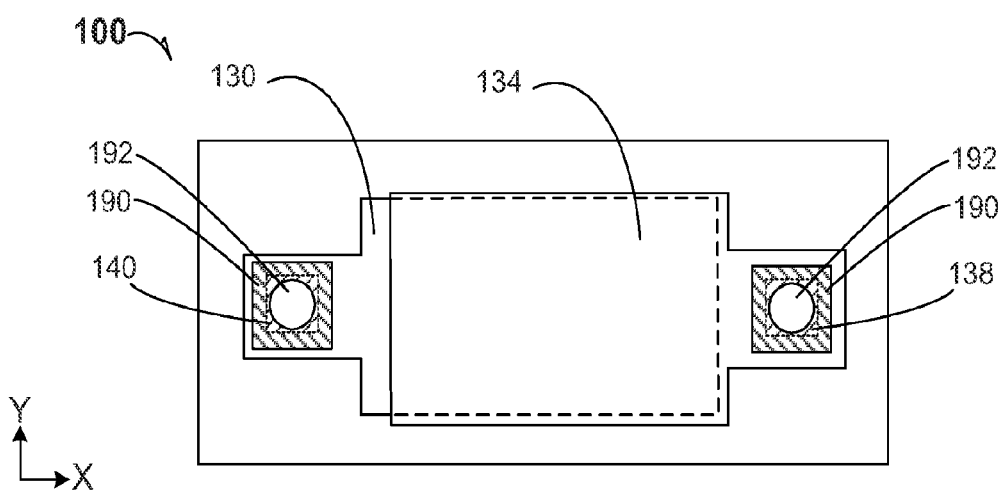
FIG. 1xy is a top plan cut-away of the capacitor structure depicted in FIG. 1 according to an example embodiment.

FIG. 1xy is a top plan cut-away of the capacitor structure 120 depicted in FIG. 1 according to an example embodiment. For illustration purposes, several structures are not shown in order to better describe selected structures. The patterned second electrode 130 is shown partially obscured (as phantom lines) by the third electrode 134. As depicted, the patterned third electrode 134 is contacted by the power via 138, and the patterned second electrode 130 is contacted by the ground via 140. The patterned first electrode 126 is not depicted in FIG. 1xy, but it would be disposed below the patterned second electrode 130 as seen in FIG. 1. The power- and ground vias 138 and 140, respectively, are contacted by pads 190 that contact in turn contact the electrical bumps 192.

Electrode effective area may be determined by the overlap of two adjacent electrodes, such as the patterned second electrode 130 and the patterned third electrode 134 as seen in a Z-projection of one X-Y area onto the other. In an embodiment, the X-Y footprint of the on-chip capacitor 100 is about 10 μm×10 μm. In an embodiment where a given semiconductive substrate 110 has an X-Y footprint of about 10 mm×10 mm and where the on-chip capacitor 100 has an X-Y footprint of about 10 μm×10 μm, a total of about one-million (1,000,000) on-chip capacitors are disposed within a passivation structure immediately above a metallization of a semiconductive substrate.

Other capacitor structures are set forth in this disclosure (see FIGS. 2-8). Where useful, a combination of different on-chip capacitor structures is fabricated within a passivation structure to provide effective capacitors for given active-device circuits that are located at the active surface of a given semiconductive substrate.

Figure 2:
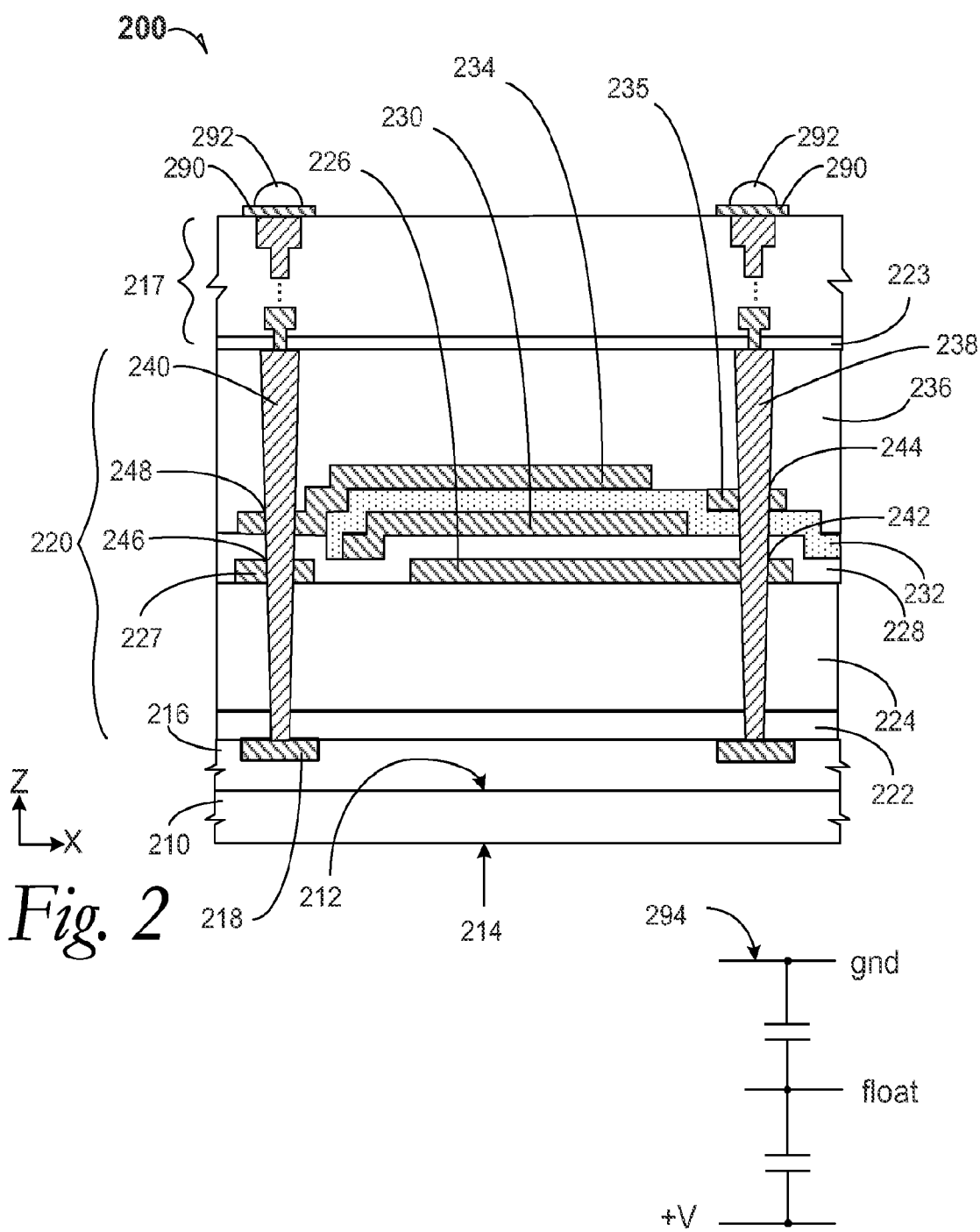

FIG. 2 is a cross-section elevation of an on-chip capacitor 200 according to an example embodiment. A semiconductive substrate 210 includes an active surface 212 and a backside surface 214 as well as a BE metallization 216. The BE metallization 216 may include metal layers such as from M1 up to $M_n$ 218 such as M11, but not limited to M11. In an embodiment, the upper metallization trace 218 is an M11 metallization 218.

An on-chip capacitor structure 220 is disposed above and on the BE metallization 216. In an embodiment, a via etch-stop first layer 222 is formed upon the upper metallization trace 218 as it is exposed through the BE metallization 216. Thereafter, a first VILD 224 is disposed above the upper metallization trace 218. In this embodiment, the first VILD 224 is disposed above and on the via etch-stop first layer 222.

A patterned first electrode 226 is disposed upon the first VILD 224. During patterning of the patterned first electrode 226, a dummy first electrode 227 is also formed. A capacitor first dielectric layer 228 is conformally disposed over the patterned first electrode 226. It can be seen that a topography has been started with the capacitor first dielectric layer 228 entirely covering the patterned first electrode 226 as well as exposed portions of the first VILD 224. A patterned second electrode 230 is conformally disposed over the capacitor first dielectric layer 228. The patterned second electrode 230 is a "floater" electrode as it is not attached to either of a power terminal 238 or a ground terminal 240. A capacitor second dielectric layer 232 is conformally disposed over the patterned second electrode 230. A patterned third electrode 234 is conformally disposed over the capacitor second dielectric layer 232. During patterning of the patterned third electrode 234, a dummy third electrode 235 is also formed. And a second VILD 236 is disposed over the capacitor second dielectric layer 232 as well as the patterned third electrode 234 and the dummy third electrode 235.

In an embodiment, electrode thickness is in a range from 20 nm to 50 nm. For example, terminated electrodes may be of a thickness different from floater electrodes. In an example embodiment, the first- and third electrode 226 and 234, respectively, are 20 nm thick and the second electrode 230 is 50 nm thick. In an example embodiment, the first- and third electrode 226 and 234, respectively, are 40 nm thick and the second electrode 230 is 20 nm thick.

Electrical coupling of the capacitor structure 220 between the semiconductive substrate 210 and the outside world is accomplished by the power via 238 and the ground via 240. As illustrated in this embodiment, the power via 238 is in contact with the patterned first electrode 226. The patterned second electrode 230 is a floater electrode disposed between the patterned first electrode 226 and the patterned third electrode 234. Grounding is accomplished in this embodiment by direct contact between the ground via 240 and the patterned third electrode 234.

It may now be appreciated that the power via 238 may be referred to as a first via 238 having a first-coupled configuration to at least one of the first—226, second—230, and third electrodes 234; in this embodiment to the patterned first electrode 226 and a patterned dummy third electrode 235. Similarly but according to this embodiment, the ground via 240 may be referred to as a second via 240 having a second-coupled configuration to at least one of the first—226, second—230, and third electrodes 234; in this embodiment to the patterned third electrode 234 and the dummy first electrode 227. It may therefore be appreciated that the first coupled configuration to the first via 238 is different from the second-coupled configuration to the second via 240.

It may now also be appreciated that the respective first- and second vias 238 and 240 each penetrate and contact two metal layers while connecting between the semiconductive substrate 210 and the outside world. In FIG. 2, the first via 238 penetrates and contacts at a first-electrode power contact point 242 and a third electrode dummy contact point 244. Also, the second via 240 penetrates and contacts at a third-electrode ground contact point 248 and a first dummy electrode contact point 246.

A circuit diagram 294 illustrates the functional design of the on-chip capacitor 200. The circuit diagram 294 illustrates a series configuration of capacitor electrodes that allows for a useful higher capacitance with a higher $V_{max}$ while using a middle floater electrode 230.

It may now be appreciated that in all illustrated embodiments, the first- and second vias (in FIG. 2 first via 238 and second via 240) may be further contacted to a second BE metallization 217 that is seated upon the on-chip capacitor structure 220. As illustrated, a second BE metallization 217 is fabricated upon a second BE metallization etch-stop layer 223. Metal contacts and metallization lines are depicted schematically at the bottom and top of the second BE metallization 217. Additionally, electrical bumps 292 are disposed on pads 290 that contact the top metallization in the second BE metallization 217.

As a consequence of forming a sandwich of the on-chip capacitor structure 220 between the first BE metallization 216 and the second BE metallization 217, a $M_n$ metallization such as M12 may be split between the first BE metallization 216 and the second BE metallization 217. For example in an M12 total metallization, nine metallization layers may be in the first BE metallization 216, followed by the on-chip capacitor structure 220, followed by three metallization layers in the second BE metallization 217. Other configurations may be made depending upon a given useful application.

Figure 3:
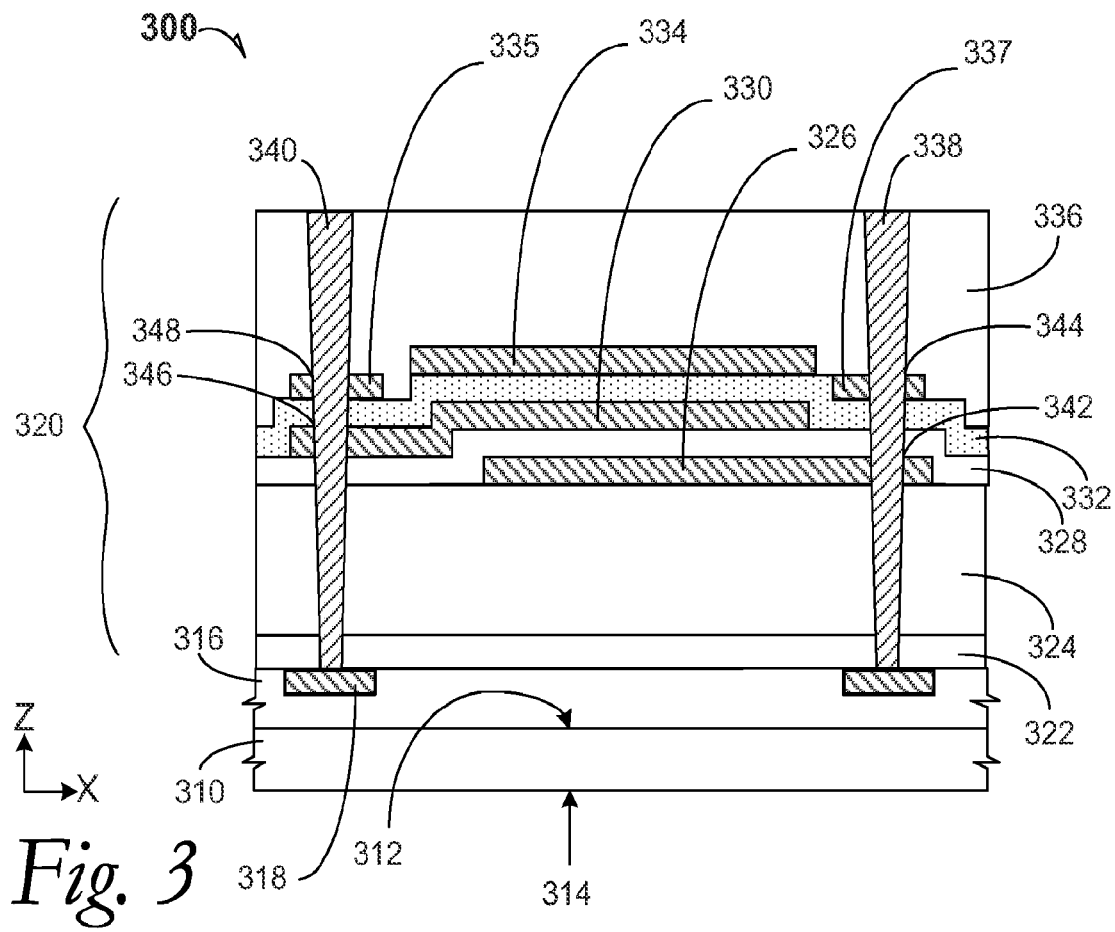
Figure 3:
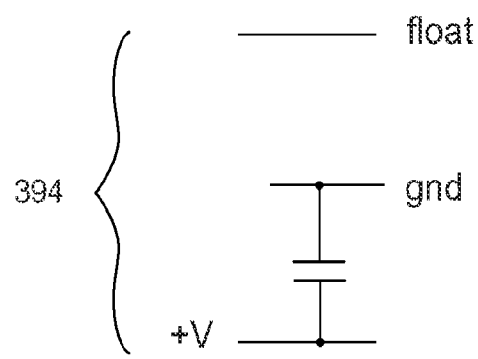

FIG. 3 is a cross-section elevation of an on-chip capacitor 300 according to an example embodiment. A semiconductive substrate 310 includes an active surface 312 and a backside surface 314 as well as a BE metallization 316. The BE metallization 316 may include metal layers such as from M1 up to $M_n$318 such as M11, but not limited to M11. In an embodiment, the upper metallization trace 318 is an M11 metallization 318.

An on-chip capacitor structure 320 is disposed above and on the BE metallization 316. In an embodiment, a via etch-stop first layer 322 is formed upon the upper metallization trace 318 as it is exposed through the BE metallization 316. Thereafter, a first VILD 324 is disposed above the upper metallization trace 318. In this embodiment, the first VILD 324 is disposed above and on the via etch-stop first layer 322.

A patterned first electrode 326 is disposed upon the first VILD 324. A capacitor first dielectric layer 328 is conformally disposed over the patterned first electrode 326. It can be seen that a topography has been started with the capacitor first dielectric layer 328 entirely covering the patterned first electrode 326 as well as exposed portions of the first VILD 324. A patterned second electrode 330 is conformally disposed over the capacitor first dielectric layer 328. A capacitor second dielectric layer 332 is conformally disposed over the patterned second electrode 330. A patterned third electrode 334 is conformally disposed over the capacitor second dielectric layer 332. During patterning of the patterned third electrode 334, dummy third electrodes 335 and 337 are also formed. And a second VILD 336 is disposed over the capacitor second dielectric layer 332 as well as the patterned third electrode 334 and the dummy third electrodes 335 and 337.

Electrical coupling of the capacitor structure 320 between the semiconductive substrate 310 and the outside world is accomplished by a power via 338 and a ground via 340. As illustrated in this embodiment, the power via 338 is in contact with the patterned first electrode 326 as well as the dummy third electrode 337. Grounding is accomplished in this embodiment by direct contact between the ground via 340 and the patterned second electrode 330. The patterned third electrode 334 is a floater electrode disposed above the patterned first electrode 326 and the patterned second electrode 330.

It may now be appreciated that the power via 338 may be referred to as a first via 338 having a first-coupled configuration to at least one of the first—326, second—330, and third electrodes 334; in this embodiment to the patterned first electrode 326 and the patterned dummy third electrode 337. Similarly but according to this embodiment, the ground via 340 may be referred to as a second via 340 having a second-coupled configuration to at least one of the first—326, second—330, and third electrodes 334; in this embodiment to the patterned second electrode 330 and the dummy third electrode 335. It may therefore be appreciated that the first coupled configuration to the first via 338 is different from the second-coupled configuration to the second via 340.

It may now also be appreciated that the respective first- and second vias 338 and 340 each penetrate and contact two metal layers while connecting between the semiconductive substrate 310 and the outside world. In FIG. 3, the first via 338 penetrates and contacts at a first-electrode power contact point 342 and a third electrode dummy contact point 344. Also, the second via 340 penetrates and contacts at a second-electrode ground contact point 346 and a dummy third electrode contact point 348.

A circuit diagram 394 illustrates the functional design of the on-chip capacitor 300. The circuit diagram 394 illustrates a bottom only configuration of capacitor electrodes that allows for a useful higher capacitance while using a top floater electrode 334. The on-chip capacitor can therefore have a different $V_{max}$ than the top electrode.

Figure 4:
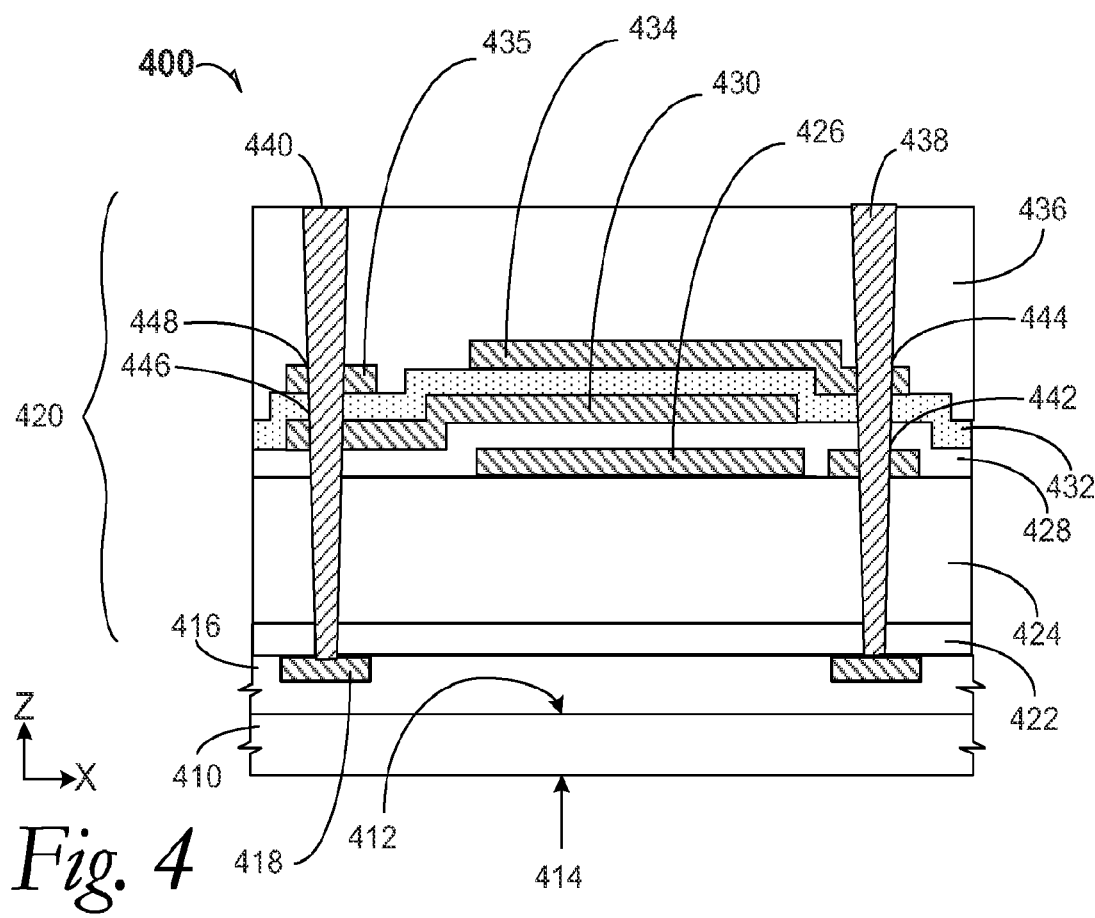
Figure 4:
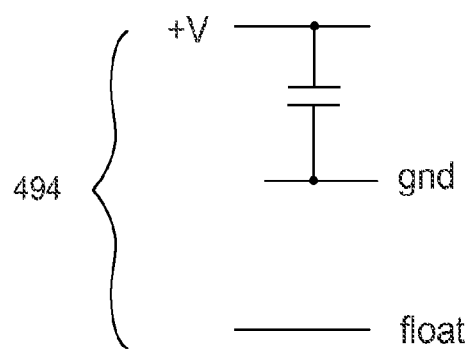

FIG. 4 is a cross-section elevation of an on-chip capacitor 400 according to an example embodiment. A semiconductive substrate 410 includes an active surface 412 and a backside surface 414 as well as a BE metallization 416. The BE metallization 416 may include metal layers such as from M1 up to $M_n$418 such as M11, but not limited to M11. In an embodiment, the upper metallization trace 418 is an M11 metallization 418.

An on-chip capacitor structure 420 is disposed above and on the BE metallization 416. In an embodiment, a via etch-stop first layer 422 is formed upon the upper metallization trace 418 as it is exposed through the BE metallization 416. Thereafter, a first VILD 424 is disposed above the upper metallization trace 418. In this embodiment, the first VILD 424 is disposed above and on the via etch-stop first layer 422.

A patterned first electrode 426 is disposed upon the first VILD 424. A capacitor first dielectric layer 428 is conformally disposed over the patterned first electrode 426. It can be seen that a topography has been started with the capacitor first dielectric layer 428 entirely covering the patterned first electrode 426 as well as exposed portions of the first VILD 424. A patterned second electrode 430 is conformally disposed over the capacitor first dielectric layer 428. A capacitor second dielectric layer 432 is conformally disposed over the patterned second electrode 430. A patterned third electrode 434 is conformally disposed over the capacitor second dielectric layer 432. During patterning of the patterned third electrode 434, a dummy third electrode 435 is also formed. And a second VILD 436 is disposed over the capacitor second dielectric layer 432 as well as the patterned third electrode 434 and the dummy third electrode 435.

Electrical coupling of the capacitor structure 420 between the semiconductive substrate 410 and the outside world is accomplished by a power via 438 and a ground via 440. As illustrated in this embodiment, the power via 438 is in contact with the patterned first electrode 426 as well as the patterned third electrode 434. Grounding is accomplished in this embodiment by direct contact between the ground via 440 and the patterned second electrode 430. It may now be appreciated that the power via 438 may be referred to as a first via 438 having a first-coupled configuration to at least one of the first—426, second—430, and third electrodes 434; in this embodiment to the patterned first electrode 426 and the patterned third electrode 434. Similarly but according to this embodiment, the ground via 440 may be referred to as a second via 440 having a second-coupled configuration to at least one of the first—426, second—430, and third electrodes 434; in this embodiment to the patterned second electrode 430 and the dummy third electrode 435. It may therefore be appreciated that the first coupled configuration to the first via 438 is different from the second-coupled configuration to the second via 440.

It may now also be appreciated that the respective first- and second vias 438 and 440 each penetrate and contact two metal layers while connecting between the semiconductive substrate 410 and the outside world. In FIG. 4, the first via 438 penetrates and contacts at a first-electrode power contact point 442 and a third electrode power contact point 444. Also, the second via 440 penetrates and contacts at a second-electrode ground contact point 446 and a dummy third electrode contact point 448.

A circuit diagram 494 illustrates the functional design of the on-chip capacitor 400. The circuit diagram 494 illustrates a bottom only configuration of capacitor electrodes that allows for a useful higher capacitance while using a bottom floater electrode 426. The on-chip capacitor 400 can therefore have a different $V_{max}$ than the bottom electrode.

Figure 5:
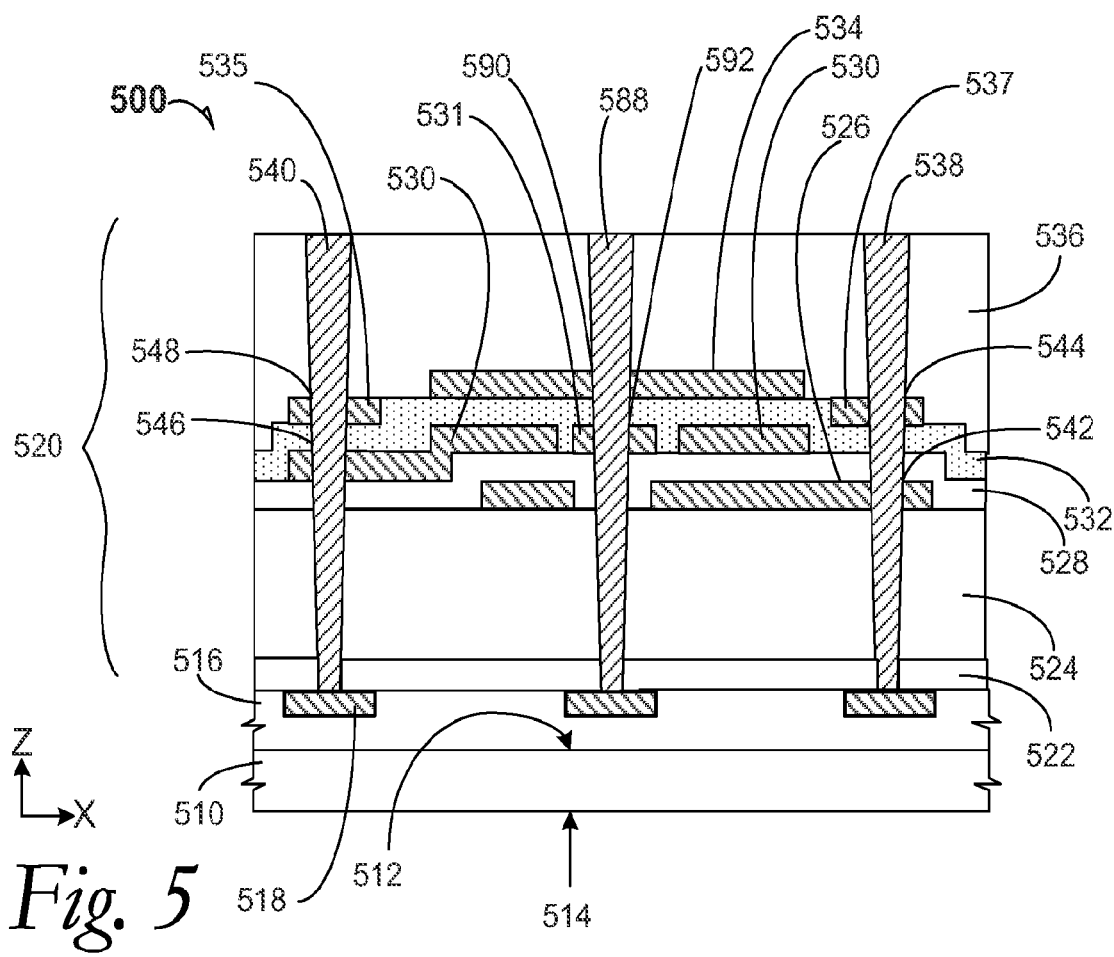
Figure 5:
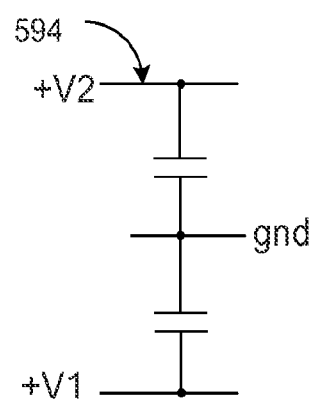

FIG. 5 is a cross-section elevation of an on-chip capacitor 500 according to an example embodiment. A semiconductive substrate 510 includes an active surface 512 and a backside surface 514 as well as a BE metallization 516. The BE metallization 516 may include metal layers such as from M1 up to $M_n$518 such as M11, but not limited to M11. In an embodiment, the upper metallization trace 518 is an M11 metallization 518.

An on-chip capacitor structure 520 is disposed above and on the BE metallization 516. In an embodiment, a via etch-stop first layer 522 is formed upon the upper metallization trace 518 as it is exposed through the BE metallization 516. Thereafter, a first VILD 524 is disposed above the upper metallization trace 518. In this embodiment, the first VILD 524 is disposed above and on the via etch-stop first layer 522.

A patterned first electrode 526 is disposed upon the first VILD 524. A capacitor first dielectric layer 528 is conformally disposed over the patterned first electrode 526. It can be seen that a topography has been started with the capacitor first dielectric layer 528 entirely covering the patterned first electrode 526 as well as exposed portions of the first VILD 524. A patterned second electrode 530 is conformally disposed over the capacitor first dielectric layer 528. A capacitor second dielectric layer 532 is conformally disposed over the patterned second electrode 530. A patterned third electrode 534 is conformally disposed over the capacitor second dielectric layer 532. During patterning of the patterned third electrode 534, a dummy third electrode 535 is also formed. And a second VILD 536 is disposed over the capacitor second dielectric layer 532 as well as the patterned third electrode 534 and the dummy third electrode 535.

Electrical coupling of the capacitor structure 520 between the semiconductive substrate 510 and the outside world is accomplished by two power vias 538 and 588 and a ground via 540. As illustrated in this embodiment, a first power via 538 is in contact with the patterned first electrode 526 as well as a patterned dummy third electrode 537. It is seen that the patterned first electrode 526 has a center hole that makes accommodation for a second power via 588 without making contact therebetween. The second power via 588 is in contact with the patterned third electrode 534 and a dummy second electrode 531. Grounding is accomplished in this embodiment by direct contact between the ground via 540 and the patterned second electrode 530. It is seen that the patterned second electrode has a center hole that makes accommodation for the dummy second electrode 531. It may now be appreciated that the first power via 538 may be referred to as a first via 538 having a first-coupled configuration to at least one of the first—526, second—530, and third electrodes 534; in this embodiment to the patterned first electrode 526 and the dummy third electrode 537. Similarly but according to this embodiment, a second power via 588 may be referred to as a second power via 588 having a subsequent-coupled configuration to at least one of the first—526, second—530, and third electrodes 534; in this embodiment to the patterned third electrode 534 and the dummy second electrode 531. Similarly but according to this embodiment, the ground via 540 may be referred to as a second via 540 having a second-coupled configuration to at least one of the first—526, second—530, and third electrodes 534; in this embodiment to the patterned second electrode 530 and the dummy third electrode 535. It may therefore be appreciated that the first coupled configuration to the first via 538 is different from the subsequent-coupled configuration to the second power via 588 as well as to the second-coupled configuration to the second via 540.

It may now also be appreciated that the respective first- second- and subsequent vias 538, 540, and 588 each penetrate and contact two metal layers while connecting between the semiconductive substrate 510 and the outside world. In FIG. 5, the first via 538 penetrates and contacts at a first-electrode power contact point 542 and a dummy third electrode contact point 544. Also, the second via 540 penetrates and contacts at a second-electrode ground contact point 546 and a dummy third electrode contact point 548. Similarly, the subsequent via 588 penetrates and contacts at a third-electrode contact point 590 and a dummy second electrode contact point 592.

A circuit diagram 594 illustrates the functional design of the on-chip capacitor 500. The circuit diagram 594 illustrates an interdependent series configuration of capacitor electrodes that allows for a useful higher capacitance with a higher $V_{max}$ while using a ground middle electrode 530.

FIG. 6 is a cross-section elevation of an on-chip capacitor 600 according to an example embodiment. A semiconductive substrate 610 includes an active surface 612 and a backside surface 614 as well as a BE metallization 616. The BE metallization 616 may include metal layers such as from M1 up to $M_n$618 such as M11, but not limited to M11. In an embodiment, the upper metallization trace 618 is an M11 metallization 618.

An on-chip capacitor structure 620 is disposed above and on the BE metallization 616. In an embodiment, a via etch-stop first layer 622 is formed upon the upper metallization trace 618 as it is exposed through the BE metallization 616. Thereafter, a first VILD 624 is disposed above the upper metallization trace 618. In this embodiment, the first VILD 624 is disposed above and on the via etch-stop first layer 622.

A patterned first electrode 626 is disposed upon the first VILD 624. Additionally, a patterned first subsequent electrode 627 is also disposed over the first VILD 624. A capacitor first dielectric layer 628 is conformally disposed over the patterned first electrode 626 and the patterned first subsequent electrode 627. It can be seen that a topography has been started with the capacitor first dielectric layer 628 entirely covering the electrodes 626 and 627 as well as exposed portions of the first VILD 624. A patterned second electrode 630 is conformally disposed over the capacitor first dielectric layer 628. A capacitor second dielectric layer 632 is conformally disposed over the patterned second electrode 630. A patterned third electrode 634 is conformally disposed over the capacitor second dielectric layer 632. Additionally, a patterned third subsequent electrode 635 is also disposed upon the capacitor second dielectric layer 632.

And a second VILD 636 is disposed over the capacitor second dielectric layer 632 as well as the third electrodes 634 and 635.

Electrical coupling of the capacitor structure 620 between the semiconductive substrate 610 and the outside world is accomplished by a power via 638 and a ground via 640. As illustrated in this embodiment, the power via 638 is in contact with both the patterned first electrode 626 and the patterned first subsequent electrode 627. Grounding is accomplished in this embodiment by direct contact between the ground via 640 with both the patterned third electrode 634 and the patterned third subsequent electrode 635.

It may now be appreciated that the power via 638 may be referred to as a first via 638 having a first-coupled configuration to at least one of the first—626, first-subsequent—627, second—630, third—634, and third-subsequent electrodes 635; in this embodiment to the patterned first 626 electrode and the patterned third electrode 634. Similarly but according to this embodiment, the ground via 640 may be referred to as a second via 640 having a second-coupled configuration to at least one of the first—626, first-subsequent—627, second—630, third—634, and third-subsequent electrodes 635; in this embodiment to the patterned first subsequent- and patterned third subsequent electrodes 627 and 635, respectively. It may therefore be appreciated that the first coupled configuration to the first via 638 is different from the second-coupled configuration to the second via 640.

It may now also be appreciated that the respective first- and second vias 638 and 640 each penetrate and contact two metal layers while connecting between the semiconductive substrate 610 and the outside world. In FIG. 6, the first via 638 penetrates and contacts at a first-electrode power contact point 642 and a third electrode power contact point 644. Also, the second via 640 penetrates and contacts at a first-subsequent electrode ground contact point 646 and a third subsequent ground electrode contact point 648.

A circuit diagram 694 illustrates the functional design of the on-chip capacitor 600. The circuit diagram 694 illustrates parallel plus series electrodes that may impose a useful moderate capacitance with a higher $V_{max}$.

Figure 7:
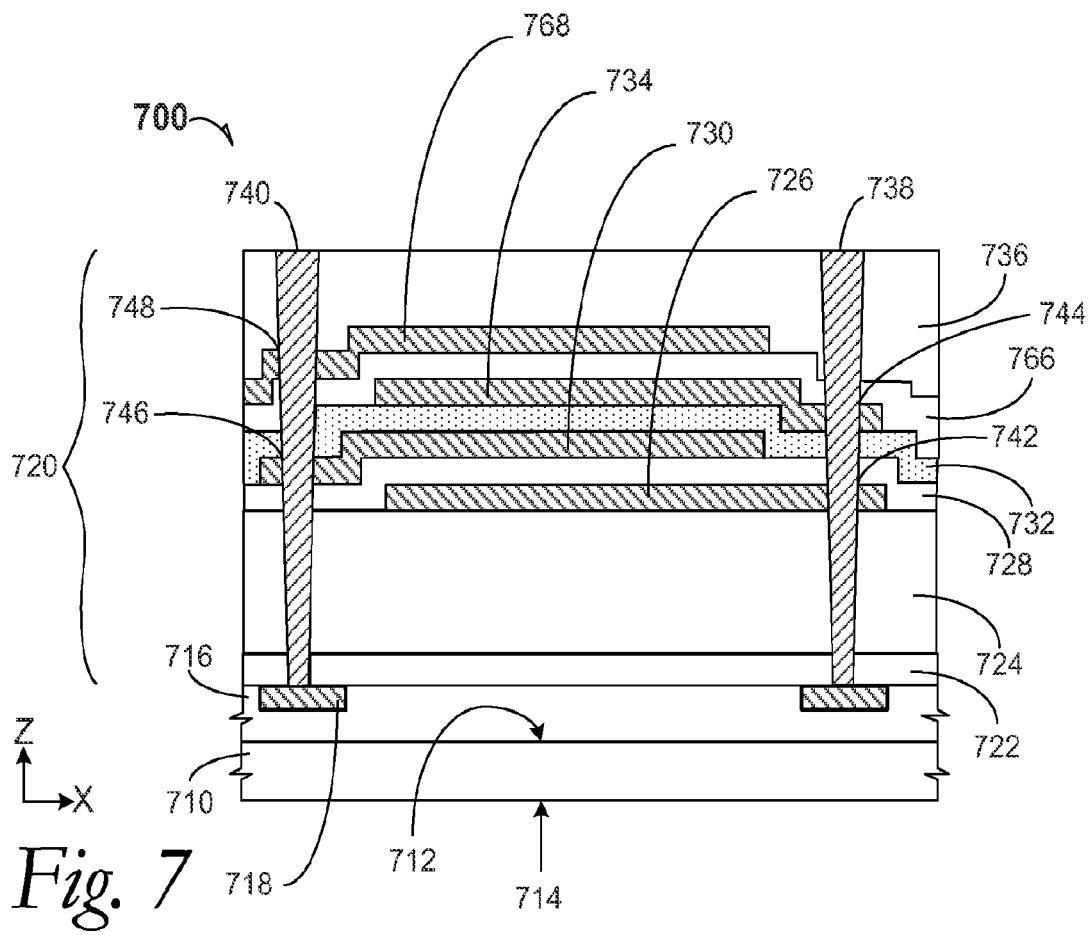
Figure 7:
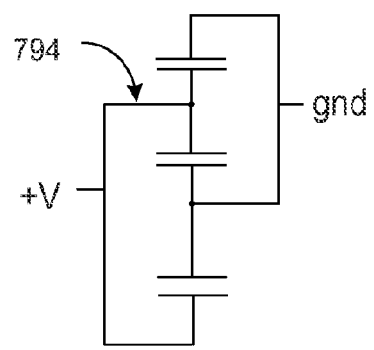

FIG. 7 is a cross-section elevation of an on-chip capacitor 700 according to an example embodiment. A semiconductive substrate 710 includes an active surface 712 and a backside surface 714 as well as a BE metallization 716. The BE metallization 716 may include metal layers such as from M1 up to $M_n$ 718 such as M11, but not limited to M11. In an embodiment, the upper metallization trace 718 is an M11 metallization 718.

An on-chip capacitor structure 720 is disposed above and on the BE metallization 716. In an embodiment, a via etch-stop first layer 722 is formed upon the upper metallization trace 718 as it is exposed through the BE metallization 716. Thereafter, a first VILD 724 is disposed above the upper metallization trace 718. In this embodiment, the first VILD 724 is disposed above and on the via etch-stop first layer 722.

A patterned first electrode 726 is disposed upon the first VILD 724. A capacitor first dielectric layer 728 is conformally disposed over the patterned first electrode 726. It can be seen that a topography has been started with the capacitor first dielectric layer 728 entirely covering the patterned first electrode 726 as well as exposed portions of the first VILD 724. A patterned second electrode 730 is conformally disposed over the capacitor first dielectric layer 728. A capacitor second dielectric layer 732 is conformally disposed over the patterned second electrode 730. A patterned third electrode 734 is conformally disposed over the capacitor second dielectric layer 732. A capacitor third dielectric layer 766 is conformally disposed over the patterned third electrode 734. A patterned fourth electrode 768 is conformally disposed over the capacitor third dielectric layer 766. And a second VILD 736 is disposed over the capacitor third dielectric layer 766 as well as the patterned fourth electrode 768.

Electrical coupling of the capacitor structure 720 between the semiconductive substrate 710 and the outside world is accomplished by a power via 738 and a ground via 740. As illustrated in this embodiment, the power via 738 is in contact with both the patterned first electrode 726 and the patterned third electrode 734. Grounding is accomplished in this embodiment by direct contact between the ground via 740 in contact with both the patterned second electrode 730 and the patterned fourth electrode 768.

It may now be appreciated that the power via 738 may be referred to as a first via 738 having a first-coupled configuration to at least one of the first—726, second—730, third—734 and fourth electrodes 768; in this embodiment to the patterned first 726 electrode and the patterned third electrode 734. Similarly but according to this embodiment, the ground via 740 may be referred to as a second via 740 having a second-coupled configuration to at least one of the first—726, second—730, third—734, and fourth electrodes 768; in this embodiment to the patterned second electrode 730 and the patterned fourth electrode 768. It may therefore be appreciated that the first coupled configuration to the first via 738 is different from the second-coupled configuration to the second via 740.

It may now also be appreciated that the respective first- and second vias 738 and 740 each penetrate and contact two metal layers while connecting between the semiconductive substrate 710 and the outside world. In FIG. 7, the first via 738 penetrates and contacts at a first-electrode power contact point 742 and a third electrode power contact point 744. Also, the second via 740 penetrates and contacts at a second-electrode ground contact point 746 and a fourth electrode ground contact point 748. The on-chip capacitor 700 represents MIM $IM^2$ structure.

A circuit diagram 794 illustrates the functional design of the on-chip capacitor 700. The circuit diagram 794 illustrates parallel +V plates that may impose a useful higher capacitance with a lower $V_{max}$.

It may now be appreciated that larger-number MIM $IM^n$ structures may be made such as four- eight- or even 10-electrode structures depending upon a given useful application. For a five-electrode structure, whether all electrodes are terminal or some are floater, the on-chip capacitor would have the terminology MIM $IM^3$. For a seven-electrode structure, whether all electrodes are terminal or some are floater, the on-chip capacitor would have the terminology MIM $IM^5$. In any event, the on-chip capacitor of a given number of plates is built upon the first BE metallization; in this embodiment upon the first BE metallization 716.

FIG. 8 is a cross-section elevation of an on-chip capacitor 800 according to an example embodiment. A semiconductive substrate 810 includes an active surface 812 and a backside surface 814 as well as a BE metallization 816. The BE metallization 816 may include metal layers such as from M1 up to $M_n$ 818 such as M11, but not limited to M11. In an embodiment, the upper metallization trace 818 is an M11 metallization 818.

An on-chip capacitor structure 820 is disposed above and on the BE metallization 816. In an embodiment, a via etch-stop first layer 822 is formed upon the upper metallization trace 818 as it is exposed through the BE metallization 816. Thereafter, a first VILD 824 is disposed above the upper metallization trace 818. In this embodiment, the first VILD 824 is disposed above and on the via etch-stop first layer 822.

A patterned first electrode 826 is disposed upon the first VILD 824. A capacitor first dielectric layer 828 is conformally disposed over the patterned first electrode 826. It can be seen that a topography has been started with the capacitor first dielectric layer 828 entirely covering the patterned first electrode 826 as well as exposed portions of the first VILD 824. A patterned second electrode 830 is conformally disposed over the capacitor first dielectric layer 828. During patterning of the patterned second electrode 830, a dummy second electrode 831 is also formed. A capacitor second dielectric layer 832 is conformally disposed over the patterned second electrode 830 and the dummy second electrode 831. A patterned third electrode 834 is conformally disposed over the capacitor second dielectric layer 832. During patterning of the patterned third electrode 834, a dummy third electrode 835 is also formed. A capacitor third dielectric layer 866 is conformally disposed over the patterned third electrode 834 and the dummy third electrode 835. A patterned fourth electrode 868 is conformally disposed over the capacitor third dielectric layer 866. And a second VILD 836 is disposed over the capacitor fourth dielectric layer 866 as well as the patterned fourth electrode 868.

Electrical coupling of the capacitor structure 820 between the semiconductive substrate 810 and the outside world is accomplished by a power via 838 and a ground via 840. As illustrated in this embodiment, the power via 838 is in contact with the patterned first electrode 826. The patterned second electrode 830 is a floater electrode disposed between the patterned first electrode 826 and the patterned third electrode 834, which is also a floater electrode. Grounding is accomplished in this embodiment by direct contact between the ground via 840 and the patterned fourth electrode 868.

It may now be appreciated that the power via 838 may be referred to as a first via 838 having a first-coupled configuration to at least one of the first—826, second—830, third—834, and fourth electrodes 868; in this embodiment to the patterned first 826 electrode and a dummy third electrode 835. Similarly but according to this embodiment, the ground via 840 may be referred to as a second via 840 having a second-coupled configuration to at least one of the first—826, second—830, third—834, and fourth electrodes 868; in this embodiment to the patterned fourth electrode 868 and the dummy second electrode 831. It may therefore be appreciated that the first coupled configuration to the first via 838 is different from the second-coupled configuration to the second via 840.

It may now also be appreciated that the respective first- and second vias 838 and 840 each penetrate and contact two metal layers while connecting between the semiconductive substrate 810 and the outside world. In FIG. 8, the first via 838 penetrates and contacts at a first-electrode power contact point 842 and a third electrode dummy contact point 844. Also, the second via 840 penetrates and contacts at a fourth-electrode ground contact point 848 and a second dummy electrode contact point 846. The on-chip capacitor 800 represents an MIM IM$^2$ structure.

A circuit diagram 894 illustrates the functional design of the on-chip capacitor 800. The circuit diagram 894 illustrates a series configuration of capacitor electrodes that allows for a useful higher capacitance with a higher $V_{max}$ while using two middle floater electrodes 830 and 834.

Figure 1A:
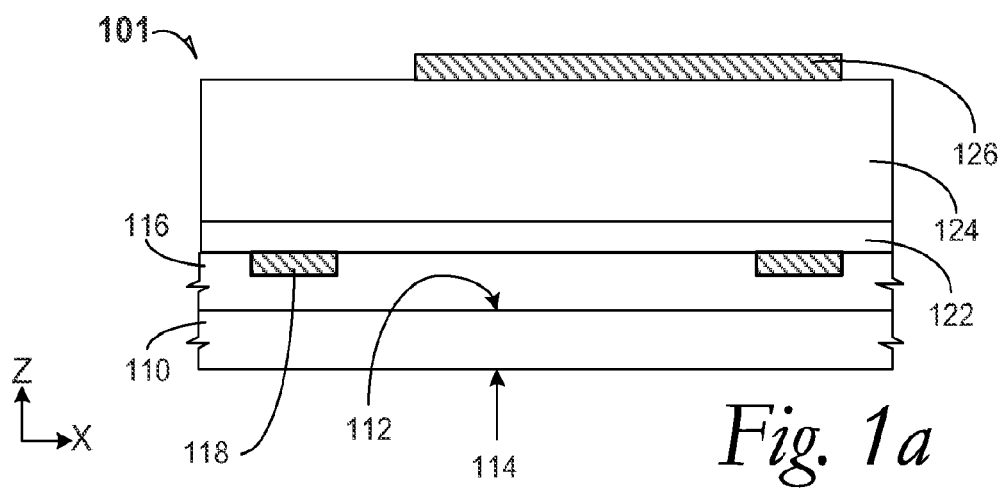
FIG. 1a is a cross-section elevation of an on-chip capacitor during processing according to an example embodiment.

FIG. 1*a* is a cross-section elevation of an on-chip capacitor 101 during processing according to an example embodiment. The on-chip capacitor 100 depicted in FIG. 1 may be achieved by this processing embodiment.

The via etch-stop first layer 122 has received a metal layer that has been patterned to form the patterned first electrode 126. Conventional technique may be used such as depositing electrode material, spinning on a mask, curing the mask to match the patterned first electrode 126, and etching the metal layer, followed by removing the mask to reveal the patterned first electrode 126 as depicted.

Figure 1B:
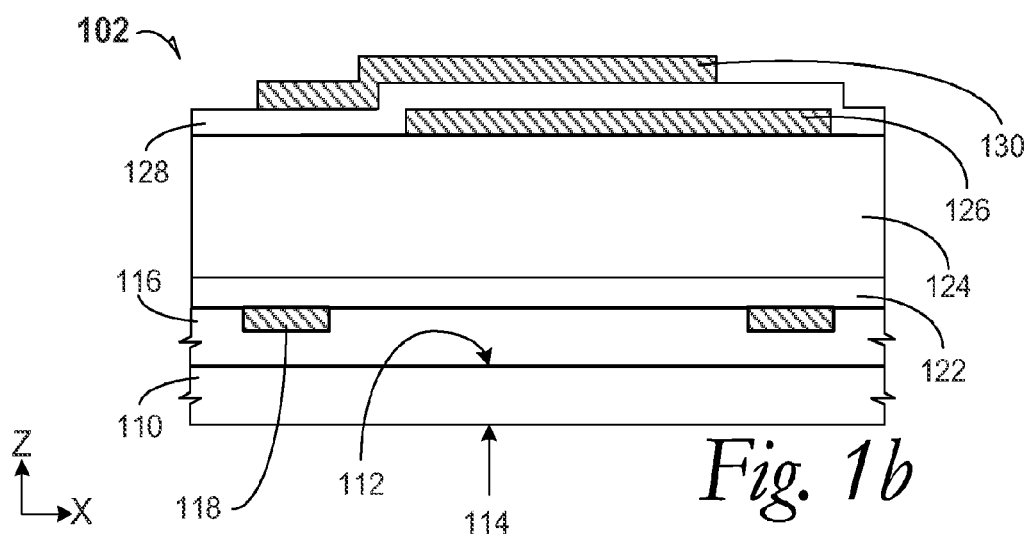
FIG. 1b is a cross-section elevation of the on-chip capacitor depicted in FIG. 1a after further processing according to an example embodiment.

FIG. 1*b* is a cross-section elevation of the on-chip capacitor depicted in FIG. 1*a* after further processing according to an example embodiment. The on-chip capacitor 102 has been processed by forming the capacitor first dielectric layer 128 conformally over the patterned first electrode 126. It can be seen that a topography has been started with the capacitor first dielectric layer 128 entirely covering the patterned first electrode 126 as well as exposed portions of the first VILD 124. Processing in FIG. 1*b* also includes forming a second metal layer conformally over the capacitor first dielectric layer 128 such as chemical-vapor depositing the second metal layer. Conventional technique may be used such as depositing electrode material, spinning on a mask, curing the mask to match the patterned second electrode 130, and etching the metal layer, followed by removing the mask to reveal the patterned second electrode 130 as depicted.

Figure 1C:
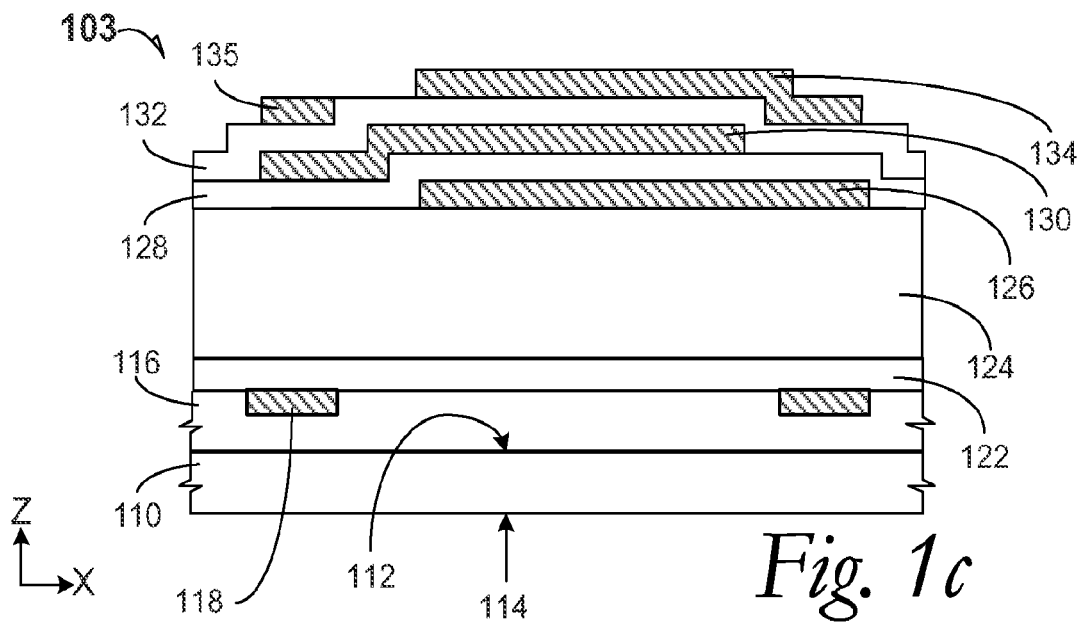
FIG. 1c is a cross-section elevation of the on-chip capacitor depicted in FIG. 1b after further processing according to an example embodiment.

FIG. 1*c* is a cross-section elevation of the on-chip capacitor depicted in FIG. 1*b* after further processing according to an example embodiment. The on-chip capacitor 103 has been processed by forming the capacitor second dielectric layer 132 conformally over the patterned second electrode 130. It can be seen that the topography has been continued over the patterned second electrode 130. Processing in FIG. 1*c* includes forming a third metal layer conformally over the capacitor second dielectric layer 132. During forming of the patterned third electrode 134, a dummy third electrode 135 is also formed.

Figure 1D:
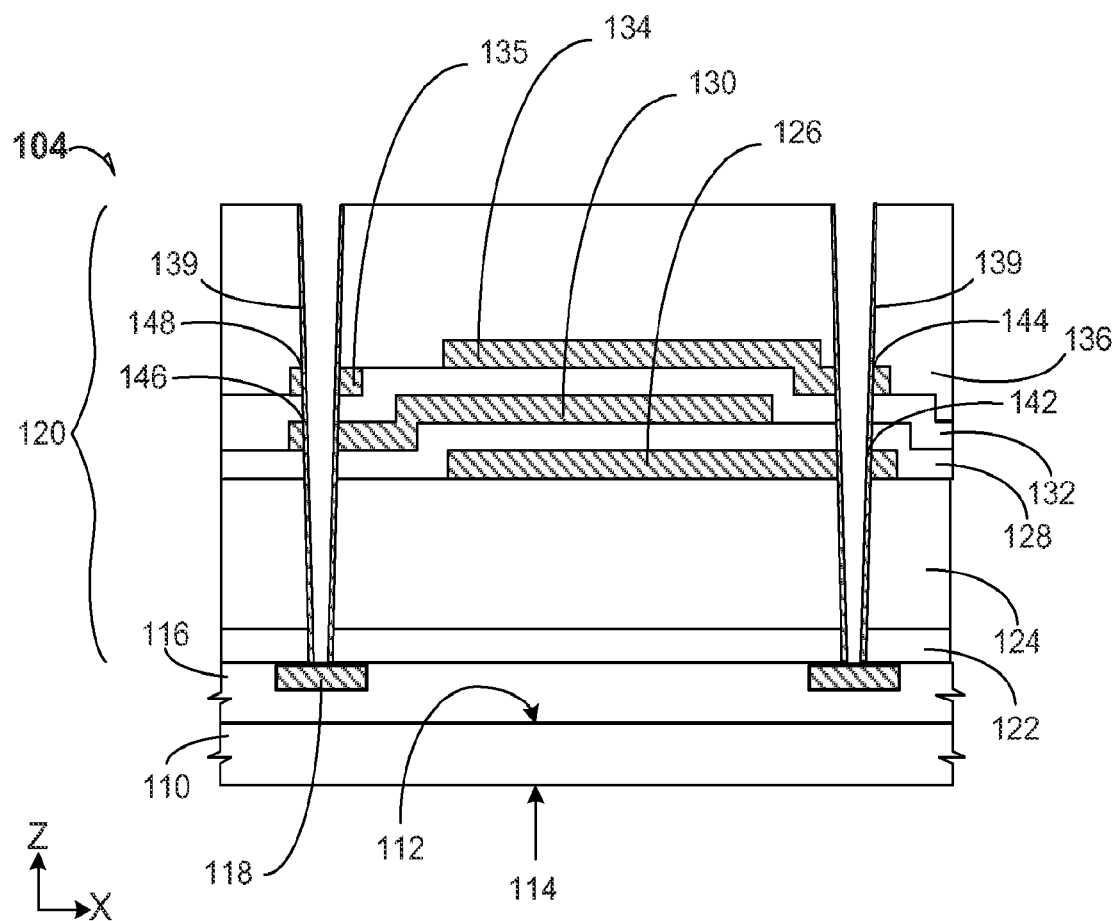
FIG. 1d is a cross-section elevation of the on-chip capacitor depicted in FIG. 1c after further processing according to an embodiment.

FIG. 1*d* is a cross-section elevation of the on-chip capacitor depicted in FIG. 1*c* after further processing according to an embodiment. The on-chip capacitor 103 has been processed by forming the second VILD 136 over the capacitor second dielectric layer 132 as well as the patterned third electrode 134 and the dummy third electrode 135. Further, recesses are formed that penetrate the on-chip capacitor 120 and that expose the upper metallization 118. The adhesion layer 139 is also depicted as having been formed in the recesses. Further processing results in embodiments that are illustrated and described for the on-chip capacitor 100 depicted in FIG. 1.

It may now be appreciated that a second BE metallization may be built upon the on-chip capacitor, followed by electrical bumps such as is illustrated in FIG. 2.

Figure 9:
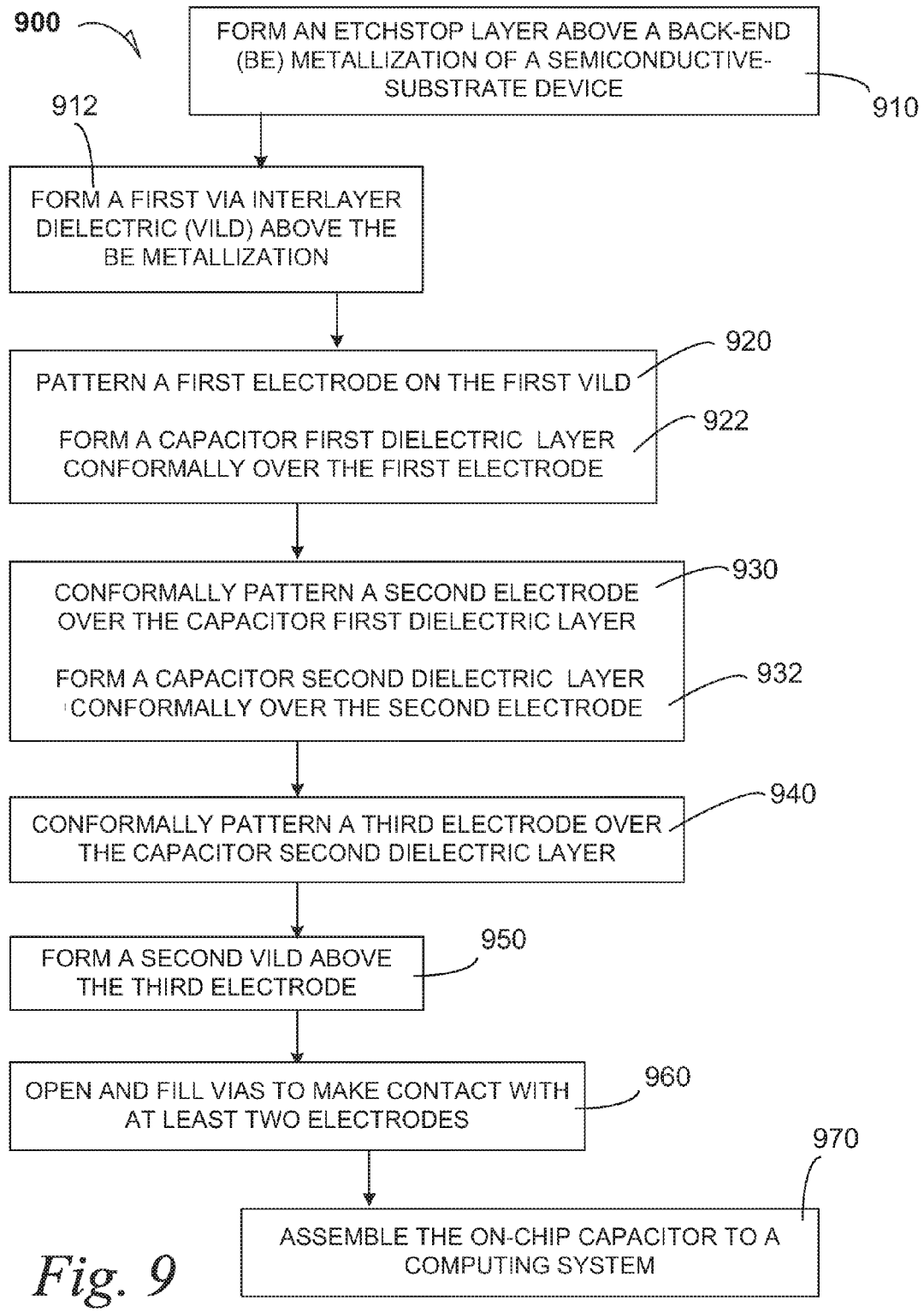
FIG. 9 is a process and method flow diagram according to an example embodiment.

FIG. 9 is a process and method flow diagram 900 according to example embodiments.

At 910, the process includes forming an etchstop layer above a BE metallization of a semiconductive substrate. In a non-limiting example embodiment, the via etch-stop first layer 122 is formed above and on the BE metallization 116.

At 912, the process includes forming a first VILD above the BE metallization. In a non-limiting example embodiment, the first VILD 124 is formed above the BE metallization 116, but also above and on the via etch-stop first layer 122.

At 920, the process includes patterning a first electrode on the first VILD. In a non-limiting example embodiment, the first electrode 126 is patterned as depicted and illustrated in FIG. 1*a*.

At 922, the process includes forming a capacitor first dielectric layer over the first electrode. In a non-limiting example embodiment, the capacitor first dielectric layer 128 is formed over the first electrode 126.

At 930, the process includes forming a second electrode over the capacitor first dielectric layer. In a non-limiting example embodiment, the second electrode 130 is patterned over the capacitor first dielectric layer 128.

At 932, the process includes forming a capacitor second dielectric layer over the second electrode. In a non-limiting example embodiment, the capacitor second dielectric layer 132, described and illustrated in FIG. 1*c*, is formed over the second electrode 130.

At 940, the process includes forming a third electrode over the capacitor second dielectric layer. In a non-limiting example embodiment, the third electrode 134 is patterned over the capacitor second dielectric layer 132. It is seen that a dummy third electrode 135 is formed as part of this example embodiment.

At 950, the process includes forming a second VILD above the third electrode. It may now be appreciated that a subsequent electrode and other structures may be formed before formation of the second VILD. In a non-limiting example embodiment, the second VILD 136 is formed over the third electrode 134.

At 960, the process includes opening and filling vias to make contact with at least two electrodes. In a non-limiting example embodiment, the first via 138 and the second via 140 make contact with the first- and third electrodes 126 and 134, and with the second electrode 130, respectively.

At 970, a method embodiment includes assembling the on-chip capacitor to a computing system.

Figure 10:
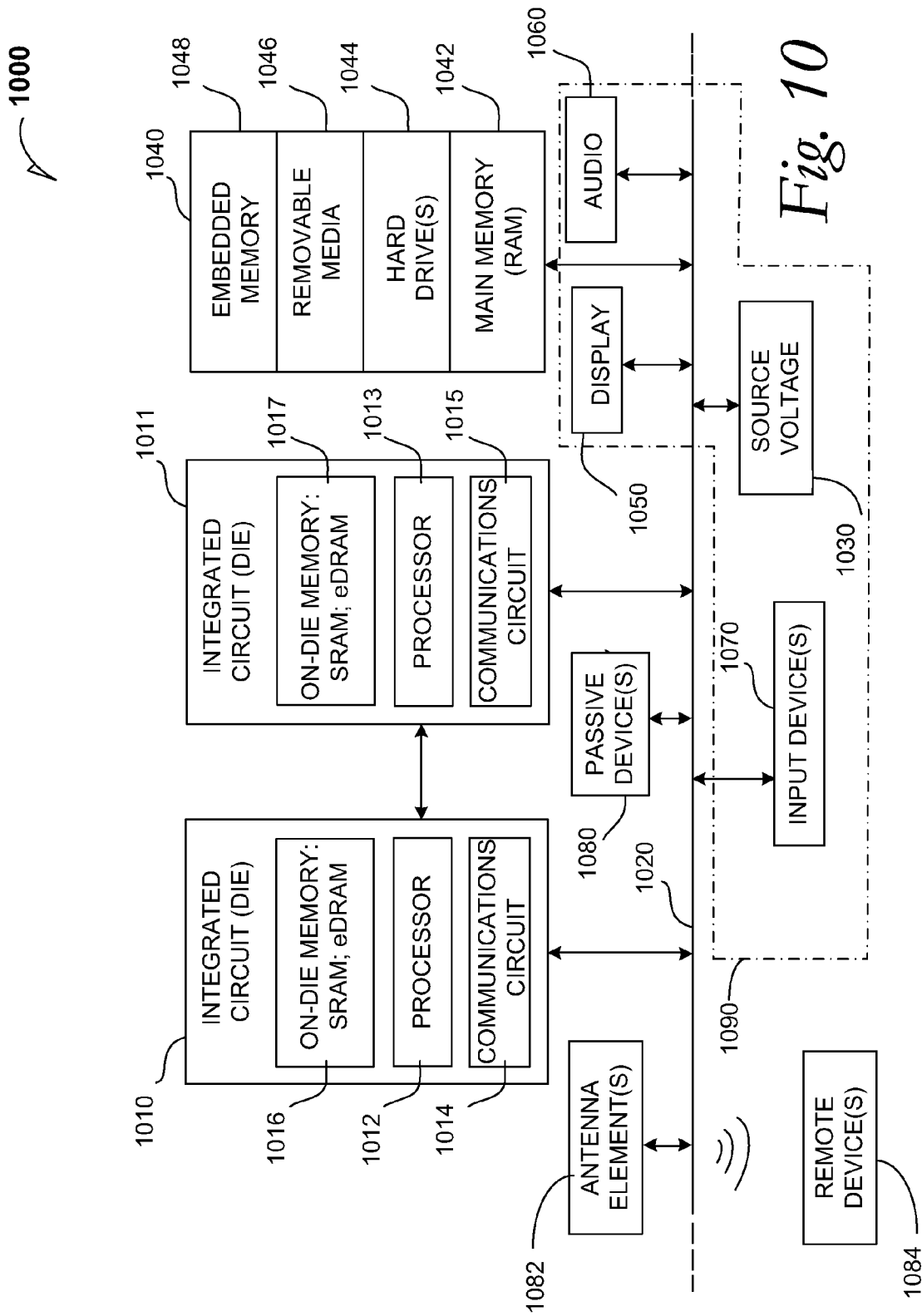
FIG. 10 is a schematic of a computer system according to example embodiments.

FIG. 10 is a schematic of a computer system according to an embodiment. The computer system 1000 (also referred to as the electronic system 1000) as depicted can embody an on-chip capacitor according to any of the several disclosed embodiments and their equivalents as set forth in this disclosure. An apparatus includes an on-chip capacitor that is assembled to a computer system. The computer system 1000 may be a smartphone. The computer system 1000 may be a tablet computer. The computer system 1000 may be a mobile device such as a netbook computer. The computer system 1000 may be a desktop computer. The computer system 1000 may be integral to an automobile. The computer system 1000 may be integral to a television. The computer system 1000 may be integral to a DVD player. The computer system 1000 may be integral to a digital camcorder.

In an embodiment, the electronic system 1000 is a computer system that includes a system bus 1020 to electrically couple the various components of the electronic system 1000. The system bus 1020 is a single bus or any combination of buses according to various embodiments. The electronic system 1000 includes a voltage source 1030 that provides power to an integrated circuit 1010. In some embodiments, the voltage source 1030 supplies current to the integrated circuit 1010 through the system bus 1020.

The integrated circuit 1010 is electrically coupled to the system bus 1020 and includes any circuit, or combination of circuits according to an embodiment. In an embodiment, the integrated circuit 1010 includes a processor 1012 that can be of any type of an apparatus that includes an on-chip capacitor embodiment. As used herein, the processor 1012 may mean any type of circuit such as, but not limited to, a microprocessor, a microcontroller, a graphics processor, a digital signal processor, or another processor. In an embodiment, SRAM embodiments are found in memory caches of the processor 1012. Other types of circuits that can be included in the integrated circuit 1010 are a custom circuit or an application-specific integrated circuit (ASIC), such as a communications circuit 1014 for use in non-equivalent wireless devices such as cellular telephones, smartphones, pagers, portable computers, two-way radios, and other electronic systems. In an embodiment, the processor 1010 includes on-die memory 1016 such as static random-access memory (SRAM). In an embodiment, the processor 1010 includes embedded on-die memory 1016 such as embedded dynamic random-access memory (eDRAM).

In an embodiment, the integrated circuit 1010 is complemented with a subsequent integrated circuit 1011 such as a graphics processor or a radio-frequency integrated circuit or both as set forth in this disclosure. In an embodiment, the dual integrated circuit 1011 includes embedded on-die memory 1017 such as eDRAM. The dual integrated circuit 1011 includes an RFIC dual processor 1013 and a dual communications circuit 1015 and dual on-die memory 1017 such as SRAM. In an embodiment, the dual communications circuit 1015 is particularly configured for RF processing.

In an embodiment, at least one passive device 1080 is coupled to the subsequent integrated circuit 1011 such that the integrated circuit 1011 and the at least one passive device are part of the any apparatus embodiment that includes an on-chip capacitor that includes the integrated circuit 1010 and the integrated circuit 1011. In an embodiment, the at least one passive device is a sensor such as an accelerometer for a tablet or smartphone.

In an embodiment, the electronic system 1000 includes an antenna element 1082 such as any coreless pin-grid array substrate embodiment set forth in this disclosure. By use of the antenna element 1082, a remote device 1084 such as a television, may be operated remotely through a wireless link by an apparatus embodiment. For example, an application on a smart telephone that operates through a wireless link broadcasts instructions to a television up to about 30 meters distant such as by Bluetooth® technology. In an embodiment, the remote device(s) includes a global positioning system of satellites for which the antenna element(s) are configured as receivers.

In an embodiment, the electronic system 1000 also includes an external memory 1040 that in turn may include one or more memory elements suitable to the particular application, such as a main memory 1042 in the form of RAM, one or more hard drives 1044, and/or one or more drives that handle removable media 1046, such as diskettes, compact disks (CDs), digital variable disks (DVDs), flash memory drives, and other removable media known in the art. In an embodiment, the external memory 1040 is part of a POP package that is stacked upon an on-chip capacitor according to any disclosed embodiments. In an embodiment, the external memory 1040 is embedded memory 1048 such an apparatus that includes an on-chip capacitor mated to both a first-level interconnect and to a POP memory module substrate according to any disclosed embodiment.

In an embodiment, the electronic system 1000 also includes a display device 1050, and an audio output 1060. In an embodiment, the electronic system 1000 includes an input device such as a controller 1070 that may be a keyboard, mouse, touch pad, keypad, trackball, game controller, microphone, voice-recognition device, or any other input device that inputs information into the electronic system 1000. In an embodiment, an input device 1070 includes a camera. In an embodiment, an input device 1070 includes a digital sound recorder. In an embodiment, an input device 1070 includes a camera and a digital sound recorder.

A foundation substrate 1090 may be part of the computing system 1000. In an embodiment, the foundation substrate 1090 is a motherboard that supports an apparatus that includes an on-chip capacitor. In an embodiment, the foundation substrate 1090 is a board which supports an apparatus that includes an on-chip capacitor. In an embodiment, the foundation substrate 1090 incorporates at least one of the functionalities encompassed within the dashed line 1090 and is a substrate such as the user shell of a wireless communicator.

As shown herein, the integrated circuit 1010 can be implemented in a number of different embodiments, an apparatus that includes an on-chip capacitor according to any of the several disclosed embodiments and their equivalents, an electronic system, a computer system, one or more methods of fabricating an integrated circuit, and one or more methods of fabricating and assembling an apparatus that includes an on-chip capacitor according to any of the several disclosed embodiments as set forth herein in the various embodiments and their art-recognized equivalents. The elements, materials, geometries, dimensions, and sequence of operations can all be varied to suit particular I/O coupling requirements including on-chip capacitor embodiments and their equivalents.

Although a die may refer to a processor chip, an RF chip, an RFIC chip, IPD chip, or a memory chip may be mentioned in the same sentence, it should not be construed that they are equivalent structures. Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Terms such as "upper" and "lower" "above" and "below" may be understood by reference to the illustrated X-Z coordinates, and terms such as "adjacent" may be understood by reference to X-Y coordinates or to non-Z coordinates.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. An on-chip capacitor, comprising:
   a semiconductive substrate including an active surface and a backside surface;
   a back-end metallization disposed upon the active surface;
   a passivation structure disposed upon the back-end metallization, wherein the passivation structure includes:
      at least first, second, and third electrodes that are parallel planar;
      capacitor first and second dielectric layers between the first and third electrodes;
      fourth and fifth electrodes;
      a first via; and
      a second via;
   wherein (a) the capacitor first dielectric layer and the capacitor second dielectric layer have the same qualitative chemistries, (b) the first via contacts and penetrates the first electrode and the second via contacts and penetrates the third electrode, (c) the fourth electrode is coplanar with the first electrode and is contacted by the second via, (d) the second electrode is a floater, (e) the fifth electrode is coplanar with the third electrode and contacted by the first via, and (f) the second electrode is above the first electrode and below the third electrode.

2. The on-chip capacitor of claim 1, wherein the first and fifth electrodes are spaced apart by the second electrode.

3. The on-chip capacitor of claim 1, wherein the third and the fourth electrodes are spaced apart by the second electrode.

4. The on-chip capacitor of claim 1, wherein the second via penetrates the fourth electrode.

5. The on-chip capacitor of claim 1, wherein the first via penetrates the fifth electrode.

6. The on-chip capacitor of claim 5, wherein the second via penetrates the fourth electrode.

7. The on-chip capacitor of claim 1, wherein the first via is a power via and the second via is a ground via.

* * * * *